(12) United States Patent
Tseng

(10) Patent No.: US 7,504,282 B2
(45) Date of Patent: Mar. 17, 2009

(54) METHOD OF MANUFACTURING THE SUBSTRATE FOR PACKAGING INTEGRATED CIRCUITS WITHOUT MULTIPLE PHOTOLITHOGRAPHY/ETCHING STEPS

(75) Inventor: Chi-Chao Tseng, Hsinchu (TW)

(73) Assignee: ASE (Shanghai) Inc., Shanghai (CN)

( * ) Notice: Subject to any disclaimer, the term of this patent is extended or adjusted under 35 U.S.C. 154(b) by 52 days.

(21) Appl. No.: 11/564,003

(22) Filed: Nov. 28, 2006

(65) Prior Publication Data

US 2007/0264750 A1 Nov. 15, 2007

(30) Foreign Application Priority Data

May 9, 2006 (TW) .............................. 95116473 A

(51) Int. Cl.
*H01L 21/00* (2006.01)
(52) U.S. Cl. ..................................................... 438/106
(58) Field of Classification Search .................. 438/106
See application file for complete search history.

(56) References Cited

U.S. PATENT DOCUMENTS

2003/0113951 A1* 6/2003 Kung et al. .................. 438/107
2005/0070084 A1* 3/2005 Hsu et al. .................... 438/612

\* cited by examiner

*Primary Examiner*—W. David Coleman
*Assistant Examiner*—Walter H Swanson
(74) *Attorney, Agent, or Firm*—Thomas, Kayden, Horstemeyer & Risley

(57) ABSTRACT

A method of manufacturing a substrate for packaging ICs is disclosed, which coats a thin conductive layer on the bottom surface of the laminated circuit board, for electrically connecting the pad and the circuit pattern formed on the bottom surface after one line photolithography/etching step. The pad formed on the top surface of the laminated circuit board can be electrically connected to the power applied in the electroplating process through the electroplating layer in the through hole and the conductive layer. Hence, the times of line photolithography/etching steps required for the prior process can be reduced, thereby solving the issues of lowering yield caused by the line photolithography/etching steps.

10 Claims, 7 Drawing Sheets

METHOD OF MANUFACTURING THE SUBSTRATE FOR PACKAGING INTEGRATED CIRCUITS WITHOUT MULTIPLE PHOTOLITHOGRAPHY/ETCHING STEPS

RELATED APPLICATIONS

The present application is based on, and claims priority from, Taiwan Application Serial Number 95116473, filed May 9, 2006, the disclosure of which is hereby incorporated by reference herein in its entirety.

FIELD OF THE INVENTION

This invention relates generally to a method of manufacturing a substrate for packaging integrated circuits (ICs), and more particularly, to a method of manufacturing a substrate for packaging ICs to reduce line photolithography/etching steps.

BACKGROUND OF THE INVENTION

Following the development of integrated circuit (IC) technology, the packing requirement is more and more strict for the ICs. Nowadays, a ball grid package (BGA) technology is widely applied in most high pin-count chips such as graphic chips, chip modules and so forth. The BGA packaging substrate is classified to five types: a plastic BGA (PBGA) substrate, a ceramic BGA (CBGA) substrate, a flip-chip BGA (FCBGA) substrate, a tape BGA (TBGA) substrate, and a cavity-down PBGA (CDPBGA) substrate. An IC chip is electrically connected to the pad on the substrate via a connecting wire. Since the connecting wire is made of gold, so the pad is necessary to be coated with gold, for enhancing the connection between the connecting wire and the pad and for increasing the yield of the wiring process.

Reference is made to FIGS. 1A to 1G, which depict cross-sectional diagrams of the process flow in accordance with a selectively gold plating method of a PBGA substrate in the prior art. First of all, as shown in FIG. 1A, a laminated circuit board 100 is provided. It is understood that, the laminated circuit board 100 has not been coated with a solder mask layer, and the laminated circuit board 100 has a top surface 102 and a bottom surface 104 opposite to the top surface 102, wherein the laminated circuit board 100 has at least a through hole 100a therein. Next, as shown in FIG. 1B, the laminated circuit board 100 is subjected to panel plating for forming an electroplated layer 110 thereon, wherein the electroplated layer 110 comprises a first electroplated layer 112 located on the top surface 102, a second electroplated layer 114 located on the bottom surface 104, and a third electroplated layer 116 located in the through hole 100a, and wherein the first electroplated layer 112, the second electroplated layer 114 and the third electroplated layer 116 electrically connect to one another. And then, as shown in FIG. 1C, a first photolithography/etching step is performed, for patterning the first electroplated layer 112 to form a circuit pattern 112a and a pad 112b. Subsequently, as shown in FIG. 1D, an electroplating resist pattern 120 is partially formed on the top surface 102 and the bottom surface 104 to expose the pad 112b located on the top surface 102 and an area of the second electroplated layer 114 that needs to be subsequently electroplated with a protective layer. It is understood that a photolithography step is employed in the step of forming the electroplating resist pattern 120. And then, an electroplating step is performed, for electroplating a protective layer such as a nickel/gold layer 130a on the area of the second electroplated layer 114 that is uncovered with the electroplating resist pattern 120, so as to protect the area of the second electroplated layer 114 from being oxidized. At this moment, the third electroplated layer 116 in the through hole 100a is employed to electrically connect the pad 112b on the top surface 102, so that the current required for electroplating the pad 112b on the top surface 102 is transmitted from the second electroplated layer 114 of the bottom surface 104 via the through hole 100a to the top surface 102, thereby simultaneously electroplating a nickel/gold layer 130b on the pad 112b on the top surface. Thus, the required nickel/gold layer 130a and the nickel/gold layer 130b are simultaneously electroplated on top surface 102 and the bottom surface 104, as shown in FIG. 1D. Consequently, the electroplating resist pattern 120 is removed, as shown in FIG. 1E. Next, a second photolithography/etching step is performed, for patterning the second electroplated layer 114 to form a circuit pattern 114a and a pad 114b. It can be understood that, during the second photolithography/etching step, a required photoresist pattern 140 is formed on the top surface 102 and the bottom surface 104, followed by etching the second electroplated layer 114 to define the circuit pattern 114a and the pad 114b, as shown in FIG. 1F. And then, the photoresist pattern 140 is removed. Afterward, as shown in FIG. 11G, a solder mask layer 150 is formed on the top surface 102 and the bottom surface 104, so as to complete the prior PBGA substrate that is subjected to selectively gold plating. During the selectively gold plating process in the prior art, the production of the PBGA substrate for carrying chips is necessarily subjected to at least twice of line photolithography/etching steps, resulting in higher production cost and lowering product yield due to many times of line photolithography/etching steps.

Another selectively gold plating process in the prior art is to dispose many plating bars on the PBGA substrate for electroplating the nickel/gold layer on the pads. However, so many plating bars occupy much of the area of the PBGA substrate, for decreasing the area for disposing wires. In addition, for applying the PBGA substrate in high frequency, it easily leads to occur the problem of noise caused by the antenna effect due to redundant plating bars.

SUMMARY OF THE INVENTION

Accordingly, there is an urgent need for improving the manufacturing method in respect of selectively gold plating, for solving the issues of lowering yield caused by many times of line photolithography/etching steps, so as to achieve the purpose of raising the product quality and the process yield.

An aspect of the present invention provides a method of manufacturing a substrate for packaging ICs, which coats a thin conductive layer on the bottom surface of the laminated circuit board, for electrically connecting the pad and the circuit pattern formed on the bottom surface after one line photolithography/etching step. The pad formed on the top surface of the laminated circuit board can be electrically connected to the power applied in the electroplating process through the electroplating layer in the through hole and the conductive layer. Hence, the times of line photolithography/etching steps required for the prior process can be reduced, thereby solving the issues of lowering yield caused by the line photolithography/etching steps.

According to the aforementioned aspect of the present invention, a method of manufacturing a substrate for packaging ICs is provided, which comprises steps as follows. A laminated circuit board having a top surface and a bottom surface opposite to the top surface is provided, wherein the laminated circuit board has at least a through hole. Next, a metal pattern layer is formed on the laminated circuit board, wherein the metal layer comprises a first metal layer located on the top surface, a second metal layer located on the bottom surface, and a third metal layer located in the through hole, and wherein the first metal layer, the second metal layer and the third metal layer electrically connect to one another. And then, a photolithography/etching step is performed, for patterning the first metal layer to form a first circuit pattern and a first pad, and for patterning the second metal layer to form a second circuit pattern and a second pad. Subsequently, a conductive layer is formed on the bottom surface, wherein the conductive layer electrically connects the second circuit pattern and the second pad. Next, an electroplating resist pattern is formed on the laminated circuit board to expose the first pad located on the top surface and the second pad located on the bottom surface. And then, an electroplating step is performed, for forming a protective layer on the first pad and the second pad. Consequently, the electroplating resist pattern is removed. Next, a microetching step is performed for removing the conductive layer. Afterward, a protective layer is formed on the laminated circuit board.

In a preferred embodiment of the present invention, the aforementioned laminated circuit board may be a multilayer circuit board.

In a preferred embodiment of the present invention, the aforementioned metal pattern layer may be made of a material of copper, for example.

In a preferred embodiment of the present invention, the aforementioned conductive layer may be made of a material of copper, for example.

With application to the aforementioned method of manufacturing a substrate for packaging ICs, which introduces one line photolithography/etching step to produce pads and circuit patterns on the top surface and the bottom surface of the laminated circuit board completely, and employs a conductive layer to electrically connect the circuit pattern and the pad on the bottom surface, followed by performing an electroplating process. The current required for the electroplating process can be transmitted through the conductive layer and the metal layer in the through hole to the pad on the top surface of the laminated circuit board. Thus, the present method can simultaneously electroplate the required protective layer on the top surface and the bottom surface of the laminated circuit board. In comparison with other selectively gold plating process in the prior art, the manufacturing method disclosed by the present invention can reduce the times of line photolithography/etching steps, solve the issue of lowering product yield, and greatly decrease the production time and cost.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1A:
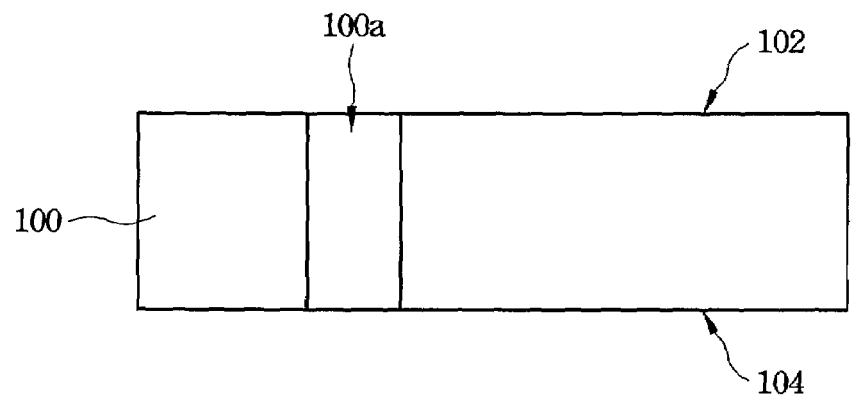
FIGS. 1A to 1G depict cross-sectional diagrams of the process flow in accordance with a selectively gold plating method of a PBGA substrate in the prior art.
Figure 1B:
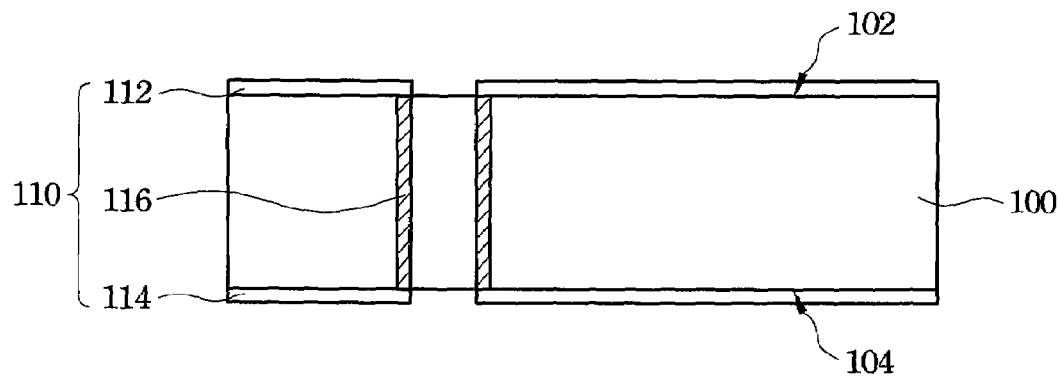
Figure 1C:
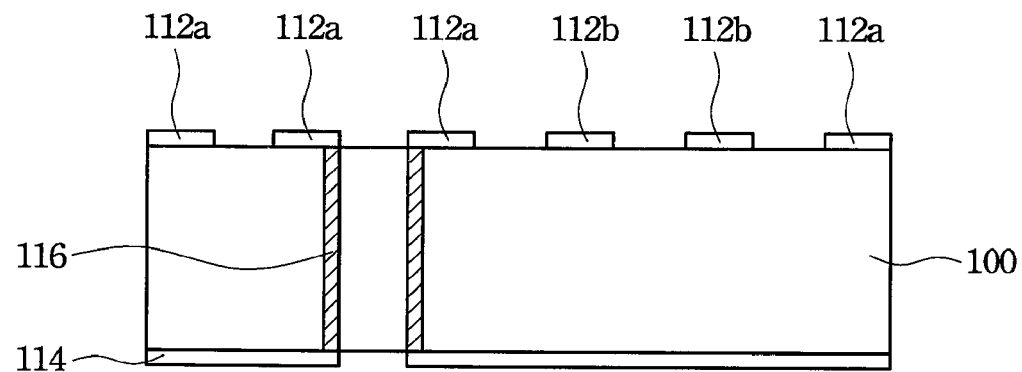
Figure 1D:
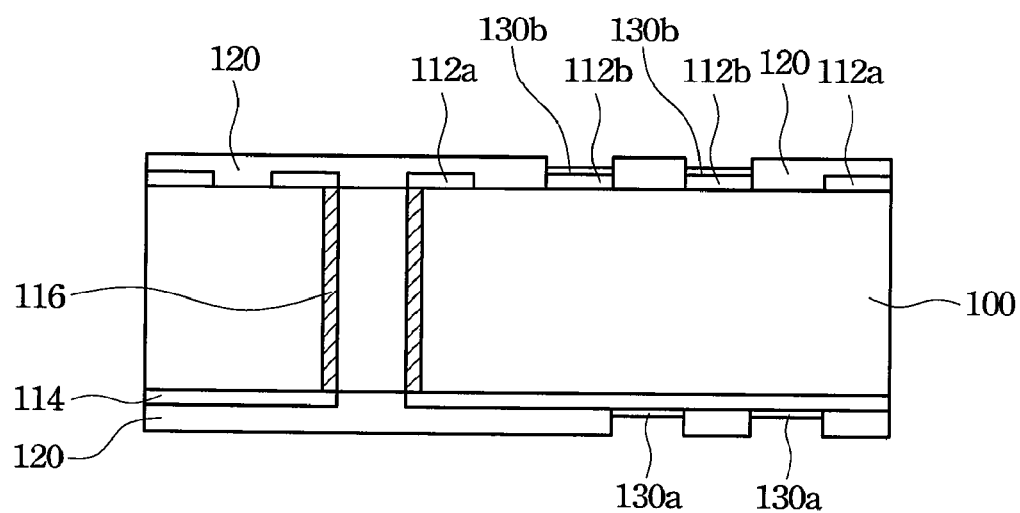
Figure 1E:
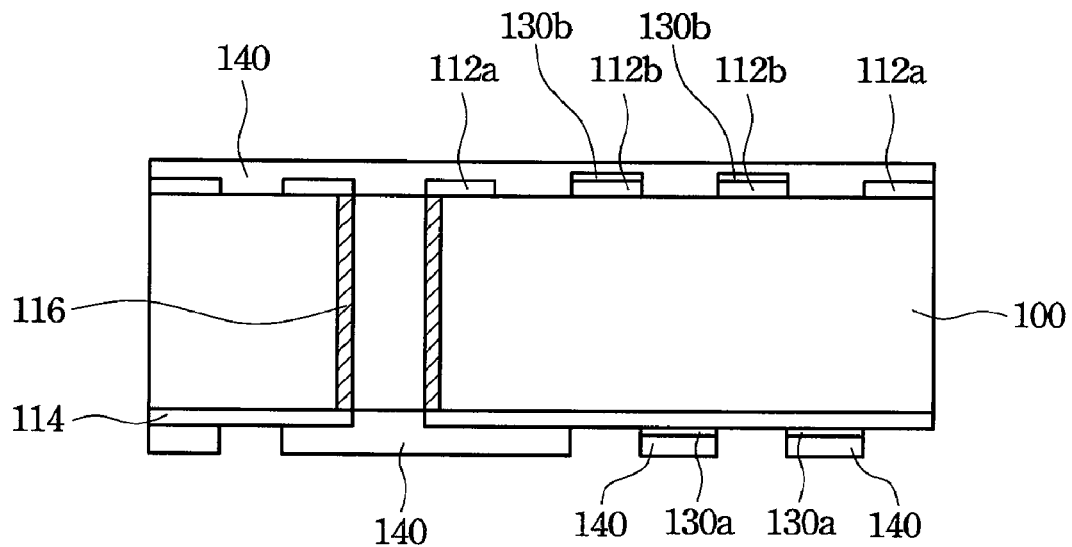
Figure 1F:
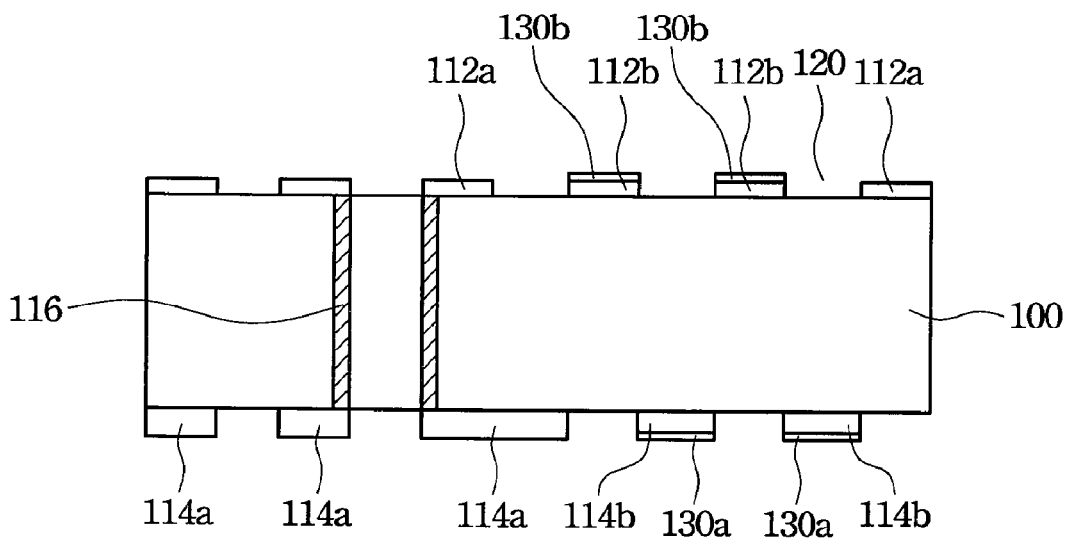
Figure 1G:
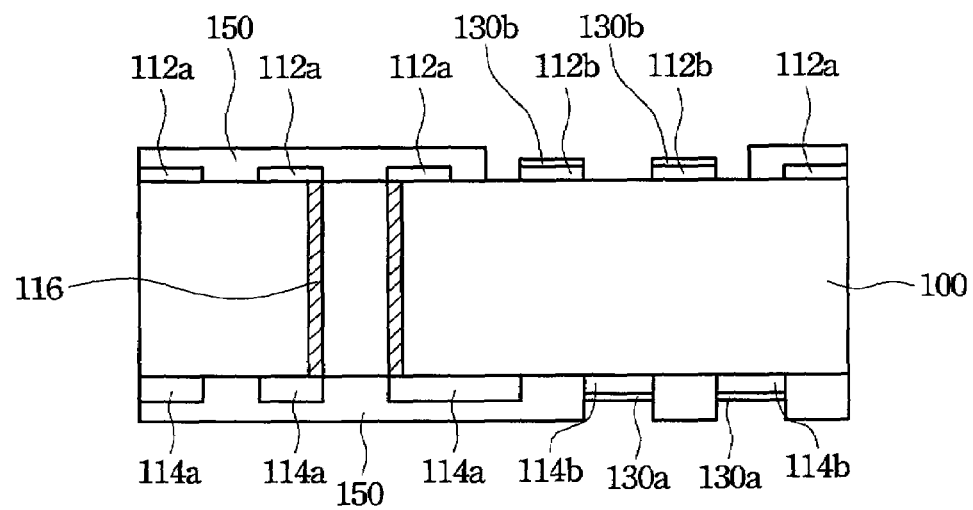

Reference is made to FIGS. 2A to 2F, which depict cross-sectional diagrams of the process flow in accordance with a preferred embodiment of the present method of manufacturing a substrate for packaging ICs. First of all, a laminated circuit board 200 is provided, which may be a multi-layer circuit board. It should be understood that, the laminated circuit board 200 has not been coated with a solder mask layer, and the laminated circuit board 200 serves to fabricate a PBGA substrate, a CBGA substrate, an FCBGA substrate, a TBGA substrate or a CDPBGA substrate. The laminated circuit board 200 has a top surface 202 and a bottom surface 204 opposite to the top surface 202, wherein the laminated circuit board 200 has at least a through hole 200a therein. Next, a metal layer 210 is formed on the laminated circuit board 200, wherein the metal layer 210 comprises a first metal layer 212 located on the top surface 202, a second metal layer 214 located on the bottom surface 204, and a third metal layer 216 located in the through hole 200a, and wherein the first metal layer 212, the second metal layer 214 and the third metal layer 216 electrically connect to one another. In this embodiment, the first metal layer 212 and the second metal layer 214 are formed by pressing copper foils, followed by forming the third metal layer 216 in a manner of plated through hole (PTH). However, it is not intended to limit the present invention by the aforementioned method of the present invention. The laminated circuit board 200 is also subjected to panel plating, so as to form the first metal layer 212, the second metal layer 214 and the third metal layer 216. Besides, in this embodiment, the metal layer 210 may be made of a material of copper.

Figure 2A:
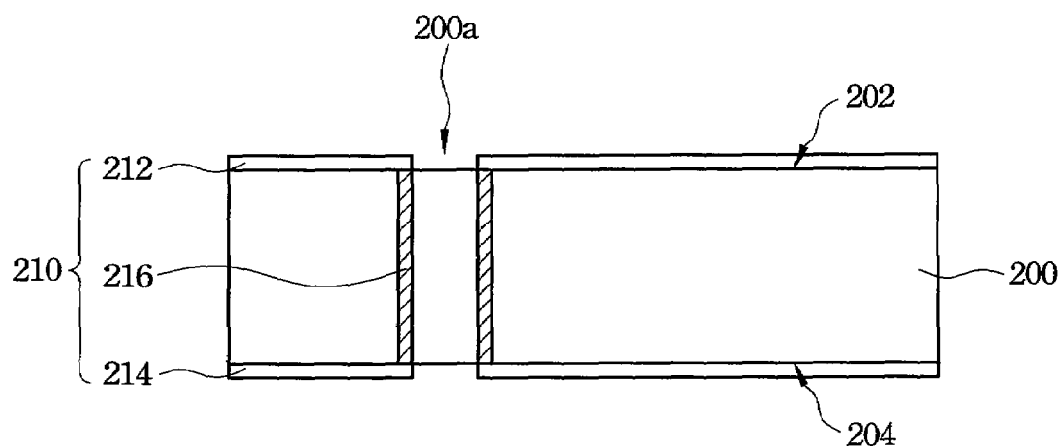
FIGS. 2A to 2F depict cross-sectional diagrams of the process flow in accordance with a preferred embodiment of the present method of manufacturing a substrate for packaging ICs.
Figure 2B:
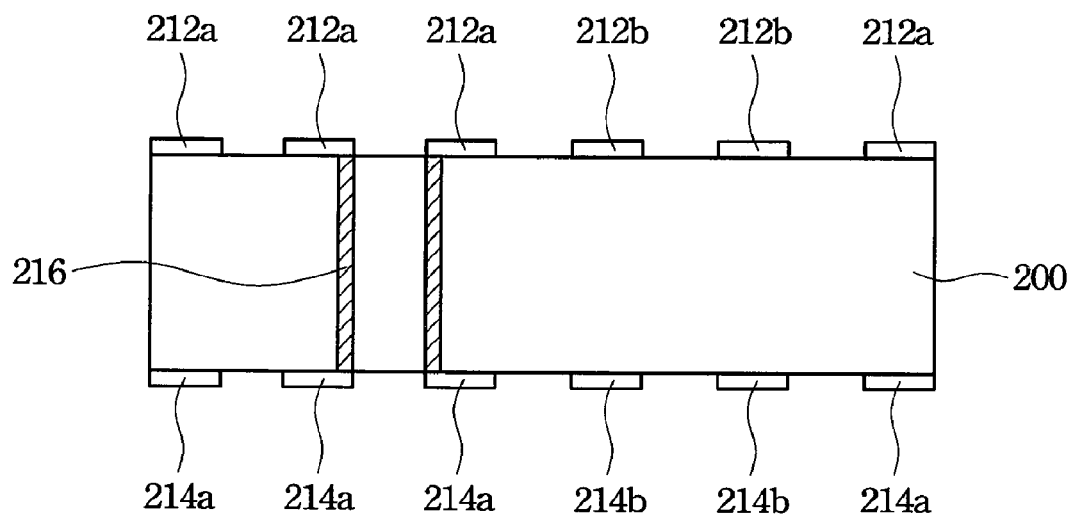

And then, as shown in FIG. 2B, a photolithography/etching step is performed, for patterning the first metal layer 212 to form a circuit pattern 212a and a pad 212b, and for patterning the second metal layer 214 to form another circuit pattern 214a and another pad 214b. In this embodiment, the circuit patterns 212a and 214a have a thickness ranging from 20 μm to 25 μm, and the pads 212b and 214b as well.

Figure 2C:
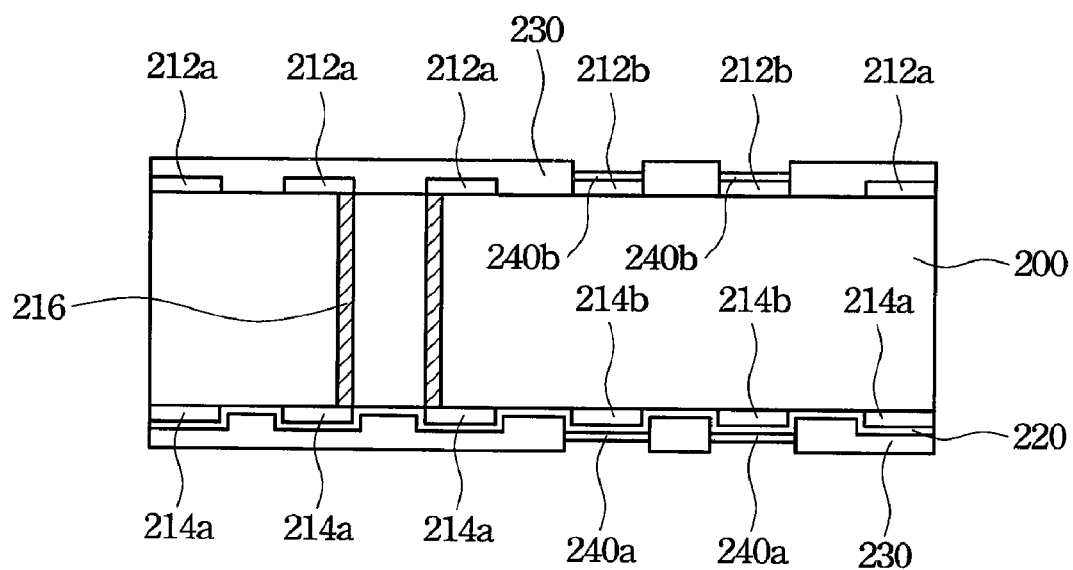

Subsequently, as shown in FIG. 2C, a conductive layer 220 is formed on the bottom surface 204 for electrically connecting the circuit pattern 214a and the pad 214b. Alternatively, in addition to forming the conductive layer 220 on the bottom surface 204, the conductive layer 220 can be simultaneously formed on the bottom surface 204 and the top surface 202. In this embodiment, the conductive layer 220 may be made of a material of copper or other materials (e.g. aluminum), by sputtering or other methods (e.g. the electroless plating method), in which the materials or the methods are solely illustrative rather than being limited herein. It is worth mentioning that, the conductive layer 220 has a very thin thickness approximately ranging from 0.2 μm to 0.5 μm.

Next, an electroplating resist pattern 230 is formed on the top surface 202 and the bottom surface 204 to expose the pad 212b located on the top surface 202 and the pad 214b located on the bottom surface 204, as shown in FIG. 2C. The electroplating resist pattern 230 is formed in details as follows. An electroplating resist layer (not shown) is coated on the laminated circuit board 200. Next, a photolithography step is performed for forming the electroplating resist pattern 230. And then, an electroplating step is performed, for electroplating a protective layer 240a on the pad 214b of the bottom surface 204, so as to protect the pad 214b from being oxidized and to increase the yield of the subsequent wiring or bumping process. In this embodiment, the protective layer 240a is a nickel/gold layer or a layer made of other oxidation-resistant materials, which are not intended to be limited herein. At this time, the conductive layer 220 is also electrically connected to the pad 212b of the top surface 202 through the third metal layer 216 in the through hole 200a, so as to electroplate the protective layer 240b on the pad 212b. The protective layer 240b is a nickel/gold layer. Accordingly, the top surface 202 and the bottom surface 204 are simultaneously coated with the protective layer 240a and the protective layer 240b, respectively, as shown in FIG. 2C.

Figure 2D:
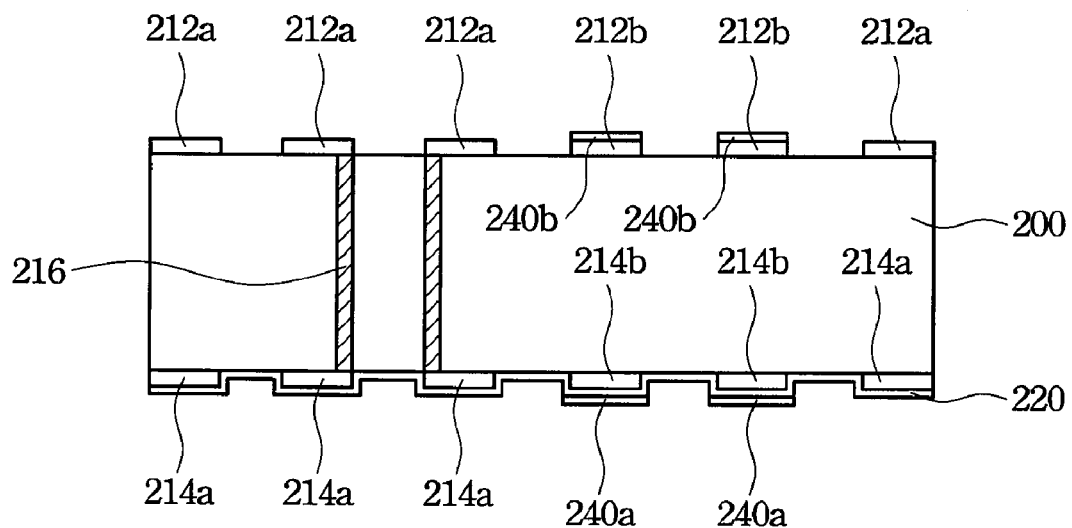
Figure 2E:
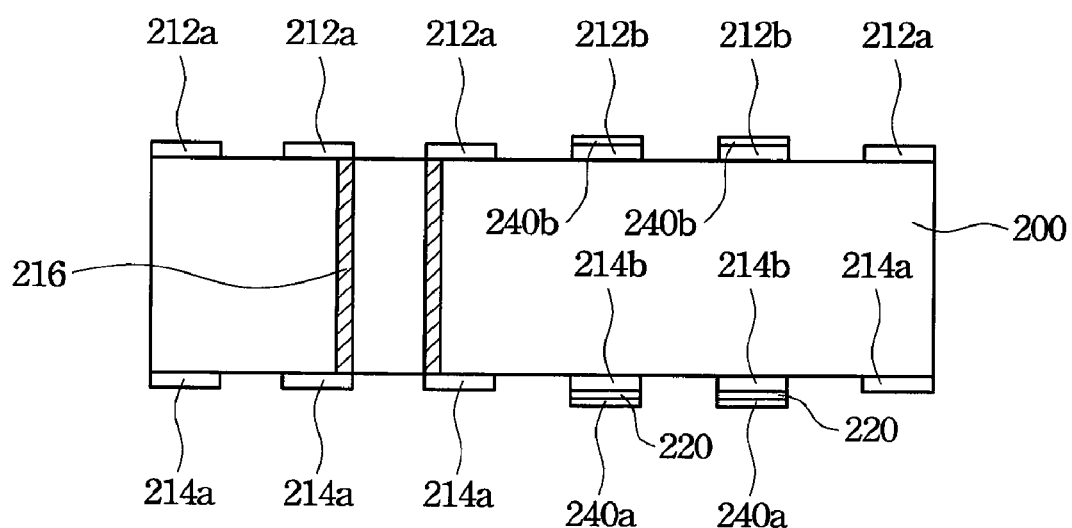

Consequently, the electroplating resist pattern 230 is removed, as shown in FIG. 2D. Next, as shown in FIG. 2E, a microetching step is performed for removing the conductive layer 220 on the bottom surface 204, so as to remain a part of the conductive layer 220 below the protective layer 240a. It can be comprehended that, the conductive layer 220 in a thickness approximately ranging from 0.2 μm to 0.5 μm is much thinner than the circuit pattern 212a, the circuit pattern 214a, the pad 212b and the pad 214b in a thickness approximately ranging from 20 μm to 25 μm, so the microetching step does not affect the thickness of the circuit pattern 212a, the circuit pattern 214a, the pad 212b and the pad 214b. It is worth mentioning that, if the conductive layer 220 is further formed on the top surface 202, the microetching step will also remove the conductive layer 220 on the top surface 202.

Figure 2F:
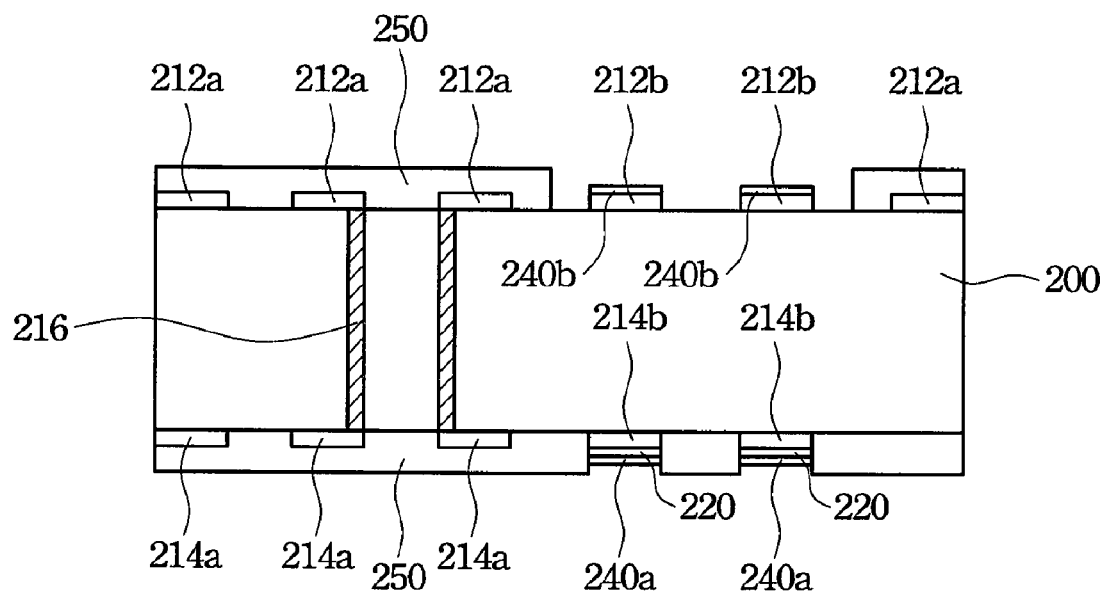

Afterward, as shown in FIG. 2F, a solder mask layer 250 is formed on the top surface 202 and the bottom surface 204, so as to complete the substrate for packaging ICs. It can be understood that only one photolithography/etching step is applied in the method of manufacturing a substrate for packaging ICs.

Figure 3:
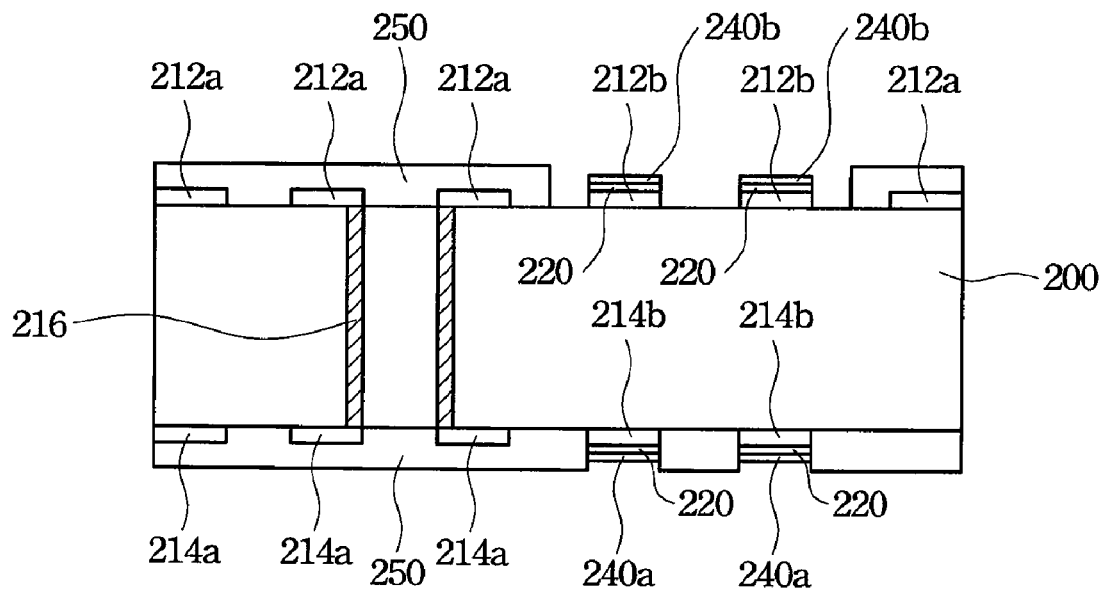
FIG. 3 depicts a cross-sectional diagram in accordance with another preferred embodiment of the substrate for packaging ICs of the present invention.

Reference is made to FIG. 2F again, which depicts a cross-sectional diagram of a substrate for packaging ICs in accordance with the present method of making the same. The substrate for packaging ICs comprises: a laminated circuit board 200 having a top surface 202 and a bottom surface 204 opposite to the top surface 202, wherein the laminated circuit board 200 has at least a through hole 200a. A line pattern 212a and a pad 212b, which are both derived from a first metal pattern layer, are located on the top surface 202. A line pattern 214a and a pad 214b, which are both derived from a second metal pattern layer, are located on the bottom surface 204. A third metal layer 216 is located in the through hole 200a, wherein the third metal layer 216 electrically connects the first metal pattern layer and the second metal pattern layer. A conductive layer 220 is located on the second metal pattern layer. A protective layer 240a and a protective layer 240b are located on the conductive layer 220 and the first metal pattern layer. And, a solder mask layer 250 is located on the laminated circuit board 200. It is worth mentioning that, according to an alternative method, another resultant substrate for packaging ICs of the present invention is produced to have the conductive layer 220 formed on the bottom surface 204 and top surface 202, and the resultant structure is shown in detail in FIG. 3. In comparison with the substrate shown in FIG. 2F, the substrate shown in FIG. 3 has the conductive layer 220 located on the first metal pattern layer and the second metal pattern layer, and the protective layer 240a and the protective layer 240b both located on the conductive layer 220.

In brief, the method of manufacturing a substrate for packaging ICs of the present invention is characterized by introducing one line photolithography/etching step to respectively form the pads and circuit patterns on the top and bottom surfaces of the laminated circuit board, electrically connecting a conductive layer to the circuit pattern on the bottom surface and the pad, and employing the conductive layer and the metal layer in the through hole to electrically connect to the pad on the top surface of the laminated circuit board. Thus, during the electroplating process, the current can be transmitted through the conductive layer and the metal layer in the through hole to the pad on the top surface of the laminated circuit board. That leads the top surface and the bottom surface of the laminated circuit board to be simultaneously plated with the required protective layer. Consequently, the present method can reduce the times of line photolithography/etching steps in the prior art, and solve the issue of lowering product yield. In addition, since the method of manufacturing a substrate for packaging ICs of the present invention does not need any plating bar in the selective gold plating in the prior art, the area for disposing wires on the PBGA substrate is increased. Especially for applying the PBGA substrate in high frequency, it effectively prevents the problem of noise due to no redundant plating bar.

Therefore, according to the aforementioned preferred embodiments, one advantage of the method of manufacturing a substrate for packaging ICs of the present invention is that, the circuit patterns and the pads on the top surface and the bottom surface of the laminated circuit board are completely produced in one step, followed by selectively electroplating the protective layer. Thus, the line photolithography/etching step required for the present invention is less than the ones required for the prior art. Besides, additional plating bars are not necessary for the procedure of selectively electroplating the protective layer of the present method, the substrate produced by the present invention has a larger area for disposing wires. Especially for applying the substrate in high frequency, the problem of noise occurs rarely. Accordingly, in comparison with the prior art, selectively electroplating the protective layer of the present method can overcome the problems such as too many line photolithography/etching steps, smaller area for disposing wires, and being liable to noise signal, resulting in greatly increasing the product quality and yield, and greatly decreasing the production time and cost as well.

As is understood by a person skilled in the art, the foregoing preferred embodiments of the present invention are merely illustrated of the present invention rather than limiting of the present invention. It is intended to cover various modifications and similar arrangements included within the spirit and scope of the appended claims. Therefore, the scope of which should be accorded the broadest interpretation so as to encompass all such modifications and similar structure.

What is claimed is:

1. A method of manufacturing a substrate for packaging ICs, comprising:
providing a laminated circuit board having a top surface and a bottom surface opposite to the top surface, wherein the laminated circuit board has at least a through hole;
forming a metal layer on the laminated circuit board, wherein the metal layer comprises a first metal layer located on the top surface, a second metal layer located on the bottom surface, and a third metal layer located in the through hole, wherein the first metal layer, the second metal layer and the third metal layer electrically connect to one another;
performing a microetching step, so that the first metal layer is patterned to form a first circuit pattern and a first pad, and the second metal layer is patterned to form a second circuit pattern and a second pad;
forming a conductive layer located on the bottom surface, wherein the conductive layer electrically connects the second circuit pattern and the second pad;
forming an electroplating resist pattern on the laminated circuit board to expose the first pad located on the top surface and the second pad located on the bottom surface;

performing an electroplating step, for forming a protective layer on the first pad and the second pad;

removing the electroplating resist pattern; and performing a microetching step for removing the conductive layer.

2. The method of manufacturing a substrate for packaging ICs according to claim 1, further comprising:

forming a solder mask layer on the laminated circuit board.

3. The method of manufacturing a substrate for packaging ICs according to claim 2, wherein the solder mask layer is a green paint.

4. The method of manufacturing a substrate for packaging ICs according to claim 1, further comprising:

forming the conductive layer on the top surface.

5. The method of manufacturing a substrate for packaging ICs according to claim 1, wherein the laminated circuit board is a multi-layer circuit board.

6. The method of manufacturing a substrate for packaging ICs according to claim 1, wherein the metal layer is made of a material of copper.

7. The method of manufacturing a substrate for packaging ICs according to claim 1, wherein the conductive layer is made of a material of copper.

8. The method of manufacturing a substrate for packaging ICs according to claim 1, wherein the conductive layer is formed by a sputtering method.

9. The method of manufacturing a substrate for packaging ICs according to claim 1, wherein the conductive layer is formed by an electroless plating method.

10. The method of manufacturing a substrate for packaging ICs according to claim 1, wherein the protective layer is a nickel/gold layer.

* * * * *